United States Patent [19]

Barnett et al.

[11] Patent Number: 5,894,246
[45] Date of Patent: Apr. 13, 1999

[54] AUTOMATICALLY TUNING A VOLTAGE CONTROLLED OSCILLATOR FOR MINIMUM SIDE BAND NOISE

[75] Inventors: Kenneth Charles Barnett, West Palm Beach; Harold Michael Cook, Boynton Beach, both of Fla.

[73] Assignee: Motorola, Inc., Schaumburg, Ill.

[21] Appl. No.: 08/939,224

[22] Filed: Sep. 29, 1997

[51] Int. Cl.[6] .................................................. H03L 7/085
[52] U.S. Cl. .................................. 331/10; 331/16; 331/34; 331/44
[58] Field of Search .................................... 331/10, 11, 16, 331/34, 44

[56] References Cited

U.S. PATENT DOCUMENTS 4,847,569  7/1989  Dudziak et al. ......................... 331/25
5,382,922  1/1995  Gersbach et al. ....................... 331/1 A Primary Examiner—Siegfried H. Grimm
Attorney, Agent, or Firm—Daniel K. Nichols

[57] ABSTRACT

A VCO (Voltage Controlled Oscillator) (10) operates in a phase-locked loop at a desired frequency. One input to the VCO is a variable control signal (24) that holds the VCO at the desired frequency. Another input is a bias input (40) that changes the operating point of a transistor (34) in the VCO and also tends to change the VCO's frequency. The value of the variable control signal (24) is sensed while the bias input (40) is changed until a desired, minimum value of the control signal is sensed. The value of the bias input at that point is held constant while operating the VCO at the desired frequency and with minimal side band noise.

10 Claims, 3 Drawing Sheets

AUTOMATICALLY TUNING A VOLTAGE CONTROLLED OSCILLATOR FOR MINIMUM SIDE BAND NOISE

FIELD OF THE INVENTION

This invention is directed generally to electronic oscillators, and particularly to automatic tuning for a VCO (Voltage Controlled Oscillator).

BACKGROUND OF THE INVENTION

Electronic devices such as RF (Radio Frequency) receivers, transmitters and various other devices include a VCO operating within a PLL (Phase Locked Loop) to maintain a desired oscillation frequency.

It is conventional practice to tune a VCO to a particular initial frequency before it leaves its factory. This is typically accomplished by using factory equipment to measure the frequency of the VCO while it is free-running (i.e., the PLL is opened), and laser-trimming a capacitor or other circuit element that modifies the frequency of the VCO. An additional trim of the bias applied to the VCO is sometimes used to provide improved SBN (Side Band Noise) performance.

The conventional practice described above has several disadvantages: it uses costly tuning equipment that requires extra space in the factory, and it is a relatively time consuming procedure.

BRIEF DESCRIPTION OF THE FIGURES

FIGS. 2–8 are graphs useful in explaining the invention, wherein:

FIG. 2 is a plot of SBN vs. collector current for the VCO transistor in FIG. 1;

FIG. 3 is a plot of frequency vs. collector current when the VCO of FIG. 1 is in a free-running condition;

FIG. 4 is a plot of collector current vs. base voltage for the VCO transistor in FIG. 1;

FIG. 5 is a plot of frequency vs. base voltage for the free-running VCO transistor in FIG. 1;

FIG. 6 is a plot of frequency vs. control voltage applied to the free-running VCO in FIG. 1;

FIG. 7 is a plot of base voltage vs. resulting control voltage when the VCO in FIG. 1 is in a phase-locked condition; and FIG. 8 is a plot of base voltage applied to the VCO transistor in FIG. 1 vs. resulting SBN when the VCO is in a phase-locked condition.

DESCRIPTION OF THE PREFERRED EMBODIMENT

Figure 1:
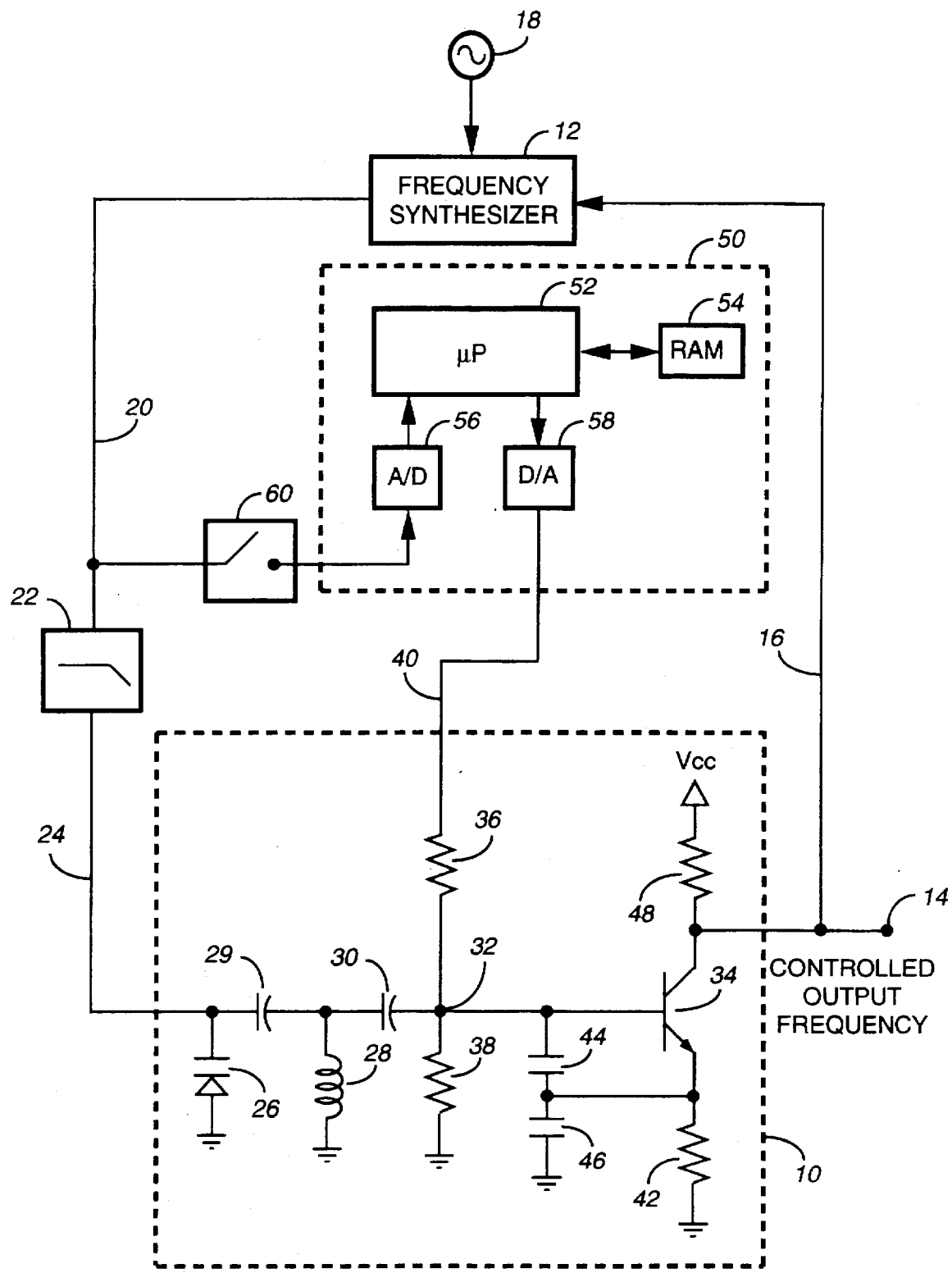
FIG. 1 is an electrical schematic diagram of a PLL in which a VCO is tuned in accordance with a preferred embodiment of the invention.

Referring to FIG. 1, a VCO 10 is shown operating within a phase locked loop. The loop includes, in addition to the VCO 10, a conventional frequency synthesizer 12 that receives two inputs. One input consists of the oscillation signal generated by the VCO 10 and present at an output node 14. That oscillator signal is coupled to the frequency synthesizer 12 via a lead 16. The other input to the synthesizer 12 is from a reference frequency oscillator 18. With these two inputs, the frequency synthesizer 12 generates a variable control signal (commonly referred to as an error signal) that is representative of the frequency difference between the reference frequency oscillator 18 and the frequency (or a multiple thereof) of the VCO 10.

The control signal provided by the synthesizer 12 is applied via a lead 20 to a conventional low pass filter 22. The output of the low pass filter 22, appearing on lead 24, is a filtered variable control signal that is coupled to an input of the VCO 10. The purpose of this variable control signal is to hold the frequency of the VCO's output signal (at node 14) at a selected frequency. Towards this end, the VCO 10 has a varactor 26 whose capacitance is varied by the varying control signal received from lead 24. A coil 28, together with the varactor 26, form a tunable tank circuit that essentially determines the frequency at which the VCO oscillates. A capacitor 29 prevents the control signal on lead 24 from being coupled to ground through the coil 28.

A coupling capacitor 30 couples the tank circuit to a node 32 that is, in turn, coupled to the base of a bi-polar transistor 34 which constitutes the active device for the VCO 10. (A field effect transistor or other type of transistor may be used in place of a bi-polar transistor). A voltage divider, comprising resistors 36 and 38, receives a bias input via a lead 40. A portion of that bias input is coupled to node 32 and to the base of the transistor 34.

The VCO's bias input, received from lead 40, varies and consequently varies the output (collector) current of transistor 34, the result of which is discussed in detail later. The emitter of transistor 34 is coupled to ground through a resistor 42. The base of the same transistor is coupled to serially connected capacitors 44, 46, with the junction between these capacitors coupled to the emitter of the transistor 34, thus providing a feedback path for sustaining oscillation.

The collector of transistor 34 is coupled to the supply voltage Vcc through a resistor 48, across which the output signal (at node 14) is developed. The phase locked loop is completed by coupling the signal appearing at the collector of transistor 34 to the frequency synthesizer 12 via the lead 16.

In order to operate the VCO 10 with minimum SBN, a logic circuit 50 is included. This logic circuit includes a microprocessor 52 (which may be a 68HC08 manufactured by Motorola, Inc.), a random access memory (RAM) 54 coupled to the microprocessor 52, and A/D (Analog to Digital) converter 56, and a D/A (Digital to Analog) converter 58. A switch 60 couples the A/D 56 to the lead 20. The switch 60 is closed only during a calibration mode for the purpose of sensing the value of the control signal supplied by the frequency synthesizer 12. The A/D converter 56 digitizes the sampled control signal and provides the digitized samples to the microprocessor 52.

During the same calibration mode, the microprocessor 52 outputs a digital bias signal to the D/A converter 58 which converts it to an analog signal that is used as a bias input to the VCO 10 via the lead 40. With this arrangement, the calibration mode operates as follows.

With power applied to the circuitry of FIG. 1, the VCO 10 begins oscillating. In response, the frequency synthesizer 12 generates a control signal that is filtered and applied to the VCO 10 via the lead 20 to tune the varactor 26 in a direction which causes the VCO to oscillate at a desired frequency.

The switch 60 closes under control of the microprocessor 52 to begin calibration. While the switch is closed, the microprocessor senses the control voltage present in the lead 20 via the switch 60 and A/D 56.

While continuing to sense the control signal on lead 20, the microprocessor 52 varies the bias input on the lead 40. This changes the operating point of the VCO by changing the collector current of the transistor 34. Consequently, parasitic capacitance associated with the transistor 34 changes, where upon the VCO 10 tends to oscillate at a different frequency. The gain of the transistor 34 is also changed, but this is a secondary effect.

The tendency of the VCO 10 to oscillate at a different frequency due to its changed operating point is countered by the frequency synthesizer 12 which senses a different frequency in the signal at node 14 and responds by varying the control signal applied to the lead 20. This change in the value of the control signal holds the VCO's oscillation frequency at the desired frequency, despite changes in the collector current of transistor 34.

The microprocessor 52 continues changing the bias input until the microprocessor senses, via switch 60 and A/D 56, that the variable control signal reaches a desired value that results in the VCO 10 operating with minimal SBN. At that point, the bias input on lead 40 reaches what is referred to herein as a final bias value. Thereafter, the microprocessor 52 holds the final bias value substantially constant while the VCO 10 operates at the desired frequency. The result of this technique is that the VCO 10 now operates with minimum SBN and at its desired frequency of operation. This completes the calibration mode and switch 60 is then opened. The VCO and the remainder of the phase-locked loop operate normally, but the previously obtained final value of bias on lead 40 is held substantially constant to insure that the VCO remains operating with minimum SBN.

The basis for the results described above will now be described with reference to the graphs shown in FIGS. 2-8.

Figure 2:
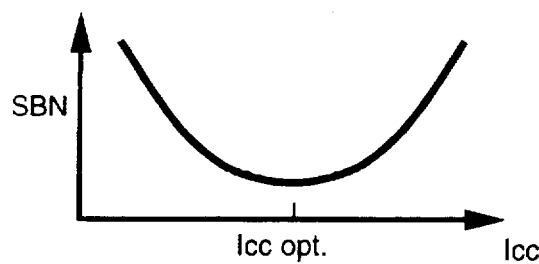
Figure 3:
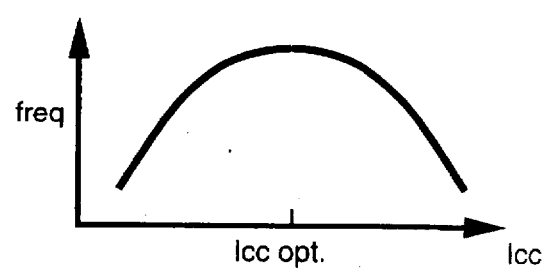

FIG. 2 shows the relationship between SBN and collector current (Icc) in the transistor 34. As shown, SBN reaches a minimum value at Icc opt. Referring to FIG. 3, the VCO's oscillation frequency is plotted versus Icc with the PLL unlocked. It can be seen that a maximum frequency of oscillation occurs at Icc opt.—the same Icc opt. that provided minimum SBN as shown in FIG. 2.

Figure 4:
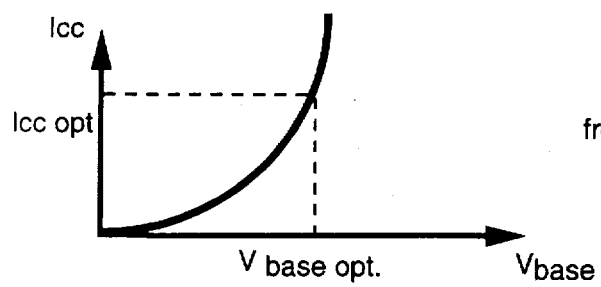
Figure 5:
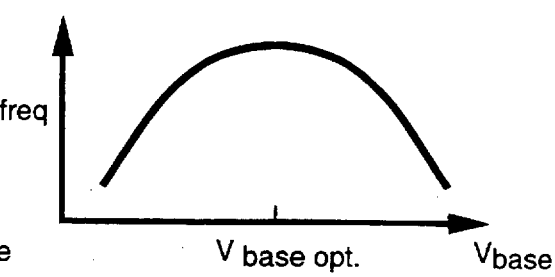

FIG. 4 shows the well known relationship between base voltage and collector current in a bi-polar transistor. There is a single base voltage (Vbase opt.) that results in Icc opt. Accordingly, the information in FIGS. 3 and 4 can be mapped together to obtain the graph shown in FIG. 5. Biasing the transistor 34 at Vbase opt. results in a collector current of Icc opt., maximizes the frequency of oscillation, and provides minimum SBN. Some conventional factory calibration techniques use the information shown in FIG. 5 to bias their VCOs to Vbase opt. The drawback, however, is that a frequency counter is required to measure the oscillation frequency. This requires extra factory space, and it is a relatively time consuming operation. Further, if calibration is required in the field, the need for a frequency counter is a disadvantage.

Figure 6:
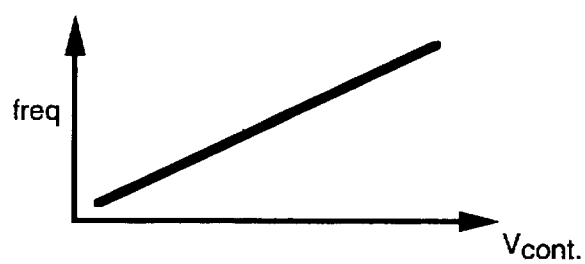

FIG. 6 shows how the VCO oscillation frequency changes (in an open loop condition) versus the control voltage (Vcont.) received on lead 20. This relationship is well known.

Figure 7:
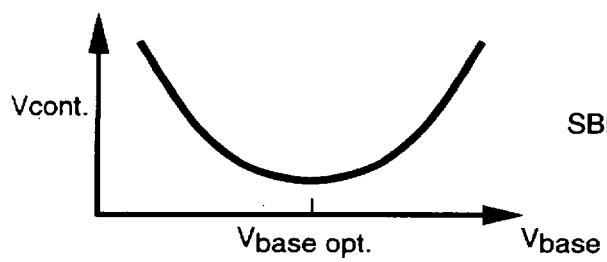

In FIG. 7, the control voltage (on lead 20) is plotted versus the base bias voltage appearing on lead 40 while the VCO 10 is operating in a closed loop condition. That is, variation in the applied base voltage (which tends to cause the VCO to oscillate at a different frequency) results in a changing control voltage that holds the VCO's oscillation frequency to the desired frequency. Note that the control voltage reaches a minimum when the base bias voltage is at Vbase opt.

Figure 8:
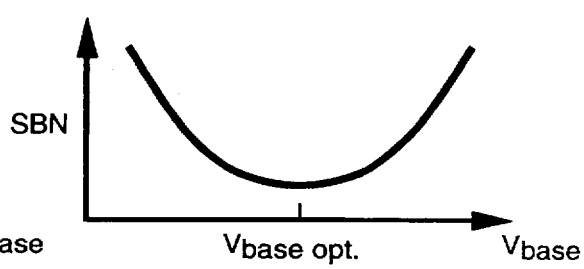

FIG. 8 is a combination of information contained in the previous graphs. It shows that a minimum value of SBN occurs at Vbase opt. This is the same Vbase opt. that provided the minimum value of control voltage as shown in FIG. 7. Hence, when the microprocessor 52 senses the control voltage on lead 20 and varies the bias on lead 40, it senses when a minimum value of Vcont. is reached. The value of the bias on lead 40 is then equal to Vbase opt., and is sometimes referred to herein as the final bias value. That final bias value is maintained on lead 40 and is preferably stored in the RAM 54 for later use as described below.

Figure 9:
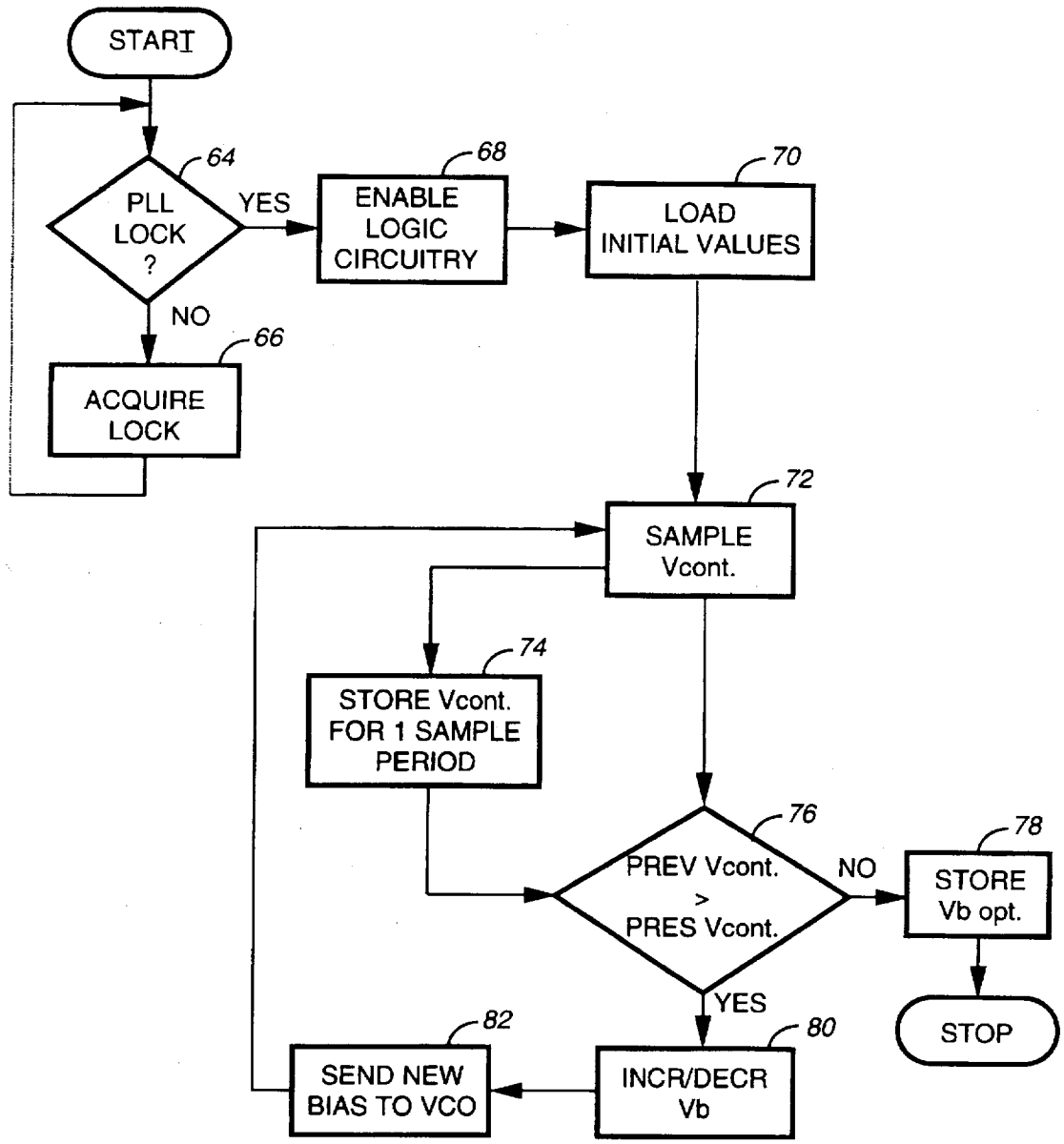
FIG. 9 is a flow chart showing how the microprocessor of FIG. 1 is programmed to tune the VCO in accordance with a preferred embodiment of the invention.

The microprocessor 52 carries out the calibration steps described above by means of a software program that is depicted by the flowchart of FIG. 9. After starting this program, the first step 64 determines whether the phase-locked loop (PLL) has attained a locked condition. If lock has not yet been achieved, the program proceeds to step 66 for acquiring a lock. This step 66 can be, for example, merely a small waiting period while the loop attains lock, or it can be a more active step which expands the bandwidth of the loop filter to achieve phase lock faster.

The program proceeds back to step 64 to again determine whether lock has been achieved. Assuming that phase lock has been achieved, the program proceeds to step 68 for enabling the logic circuitry 50 shown in FIG. 1. This logic circuitry is normally powered down in order to extend the life of any battery which may be acting as a power source. The logic circuitry 50 may be powered up or enabled only when it is required for the calibration process.

In the next step 70, initial values are loaded into the microprocessor 52. These initial values include an initial bias voltage for application to lead 40 (FIG. 1), and a maximum initial value for the control signal on lead 20. Having loaded these initial values, the program proceeds to step 72 where the control voltage on lead 20 is sampled by closing the switch 60 and converting the analog signal present on lead 20 to a digital signal by means of A/D 56. At this point, the program proceeds in two directions. Referring first to step 74, the sampled value of the control voltage is stored for one sample period. Also, the program proceeds to step 76 where a comparison is made between the previous value of the control signal and the present value of the control signal. On the first pass through this program, the previous value of the control signal is the initial value of the control signal that was loaded in step 70 and now stored per step 74. The present value will be the value that was last sampled in step 72. That is, the present value of control signal arrives at step 76 from step 72, whereas the previous value arrives from step 74 where it has been stored and delayed for one sample period.

If the execution of step 76 determines that the previous value of the control signal is not greater than the present value of the control signal, this means that the minimum value of the control signal has been reached. As shown in FIG. 7, this means that the bottom of the curve was reached when step 76 was executed, whereupon the program proceeds to step 78 to store the value of the bias voltage that corresponds to Vbase opt., and to stop the program. That value of bias voltage is stored in RAM 54 and is maintained on the lead 40 for as long as it is desired to continue the VCO oscillating at its present frequency.

If the execution of step 76 found that the previous value of the control signal exceeded the present value, that indicates that the bottom of the curve shown in FIG. 7 has not yet been reached, in which case the program proceeds to step 80. At this step, the microprocessor 52 incrementally varies the value of the bias voltage Vb by a small amount. This variation can be either an increment (INCR) or a decrement (DECR), depending on the initial value of the bias voltage that was loaded in step 70. If a relatively high value of bias voltage was loaded, then the value of Vb is decremented in step 80. Conversely, if a relatively low value of bias voltage was initially loaded (corresponding to starting closer to the origin in FIG. 7), then the value of the bias voltage is incremented at step 80. The new value of the bias voltage is now sent to the VCO 10 by applying it to lead 40 via D/A 58.

The program now returns to step 72 where steps 72–82 are repeated so as to continue incrementally changing the value of the bias voltage on lead 40 until the execution of step 76 determines that the minimum value of the control signal (Vcont.) has been reached. Step 78 is then executed and the value of Vb that resulted in the minimum value for the control signal is stored and maintained as a bias input on lead 40. In some applications, the VCO 10 may be required to switch from one frequency to another frequency. After having been calibrated and operating at a first frequency, and then switching to a second frequency and calibrating for the second frequency, an additional calibration is not necessary when the VCO 10 is switched back to the first frequency. The stored value of optimum bias voltage for that operating frequency is read from the memory 54 and applied to lead 40 as the bias input to the VCO. Thus, only one calibration process is needed at each frequency of operation.

It will be appreciated that the tuning method described herein is entirely automatic and rapid. No factory equipment or extra factory space is needed. This tuning method is particularly useful when a component of the phase locked loop must be replaced in the field. Upon receiving power, the unit will tune itself automatically to achieve operation with the lowest SBN.

Although the invention has been described in terms of a preferred embodiment, it will be obvious to those skilled in the art that many alterations and variations may be made without departing from the invention. Accordingly, it is intended that all such alterations and variations be considered as within the spirit and scope of the invention as declined by the appended claims.

What is claimed is:

1. A method of tuning a VCO (Voltage Controlled Oscillator) that operates in a phase-locked loop, wherein the VCO is responsive to a bias input for tending to change its frequency of operation, and responsive to a variable control signal which holds the frequency of the VCO at a selected frequency, comprising:

with the VCO in a phase-locked condition:
   a) sensing the variable control signal;
   b) varying the bias input, thus changing the frequency at which the VCO tends to operate, while allowing the variable control signal to change so as to hold the VCO's frequency at the selected frequency;
   c) continuing step b) until it is sensed that the value of the variable control signal is at a desired value resulting from the VCO receiving a bias input that provides minimal side band noise at which point the bias input is at a final bias value; and
   d) holding substantially constant the final bias value while operating the VCO at the selected frequency.

2. A method of tuning a VCO (Voltage Controlled Oscillator) that operates in a phase-locked loop, wherein the VCO is responsive to a bias input for tending to change its frequency of operation, and responsive to a variable control signal which holds the frequency of the VCO at a selected frequency, comprising:

with the VCO in a phase-locked condition:
   a) sensing the variable control signal;
   b) varying the bias input, thus changing the frequency at which the VCO tends to operate, while allowing the variable control signal to change so as to hold the VCO's frequency at the selected frequency;
   c) continuing step b) until a desired value of the variable control signal is sensed, at which point the bias input is at a final bias value;
   d) holding substantially constant the final bias value while operating the VCO at the selected frequency; and
   e) the VCO generating an output signal, and wherein the VCO includes, as its active element, a transistor that conducts an output current, and wherein the transistor responds to the bias input by changing its output current, resulting in a change in the amount of side band noise present in the VCO's output signal.

3. A method as set forth in claim 1 wherein the variable control signal has a minimum value, and wherein the derived value of the variable control signal is the minimum value.

4. A method as set forth in claim 1 wherein the variable control signal is in an analog form, and wherein step a) includes converting the analog form of the variable control signal to a digital value and detecting the digital value.

5. A method as set forth in claim 4 wherein the bias input is an analog signal that is derived from a digital signal, and wherein step b) includes incrementally varying the digital signal.

6. A method as set forth in claim 1 wherein the VCO is intended to operate at multiple frequencies, and wherein the final bias value is stored and re-used as the bias input whenever it is desired to operate the VCO at the selected frequency.

7. A method of tuning a VCO (Voltage Controlled Oscillator) that has a DC operating point and that operates in a phase-locked loop, wherein the VCO is responsive to a bias input for changing its DC operating point and for tending to change its frequency of operation, and responsive to a variable control signal which holds the frequency of the VCO at a selected frequency, comprising:

with the VCO in a phase-locked condition:
   a) sensing the variable control signal;
   b) varying the bias input, thus changing the DC operating point of the VCO and the frequency at which the VCO tends to operate, while allowing the variable control signal to change so as to hold the VCO's frequency at the selected frequency;
   c) continuing step b) until the variable control signal reaches a desired value that is indicative of the VCO attaining a DC operating point that results in minimum side band noise; and
   d) holding substantially constant the DC operating point attained in step c) while operating the VCO at the selected frequency.

8. A method as set forth in claim 7 wherein the variable control signal has a minimum value, and wherein the desired value of the variable control signal is the minimum value.

9. A method as set forth in claim 8 wherein the VCO is intended to operate at multiple frequencies, and wherein the bias input providing the DC operating point attained in step c) is stored and re-used as the bias input whenever it is desired to operate the VCO at the selected frequency.

10. A method of tuning a VCO (Voltage Controlled Oscillator) that has a DC operating point and that operates in a phase-locked loop, wherein the VCO is responsive to a bias input for changing its DC operating point and for tending to change its frequency of operation, and responsive to a variable control signal which holds the frequency of the VCO at a selected frequency, comprising:

with the VCO in a phase-locked condition:
a) sensing the variable control signal;
b) varying the bias input, thus changing the DC operating point of the VCO and the frequency at which the VCO tends to operate, while allowing the variable control signal to change so as to hold the VCO's frequency at the selected frequency;
c) continuing steps a) and b) until the variable control signal reaches a minimum value that is indicative of the VCO attaining a DC operating point that results in minimum side band noise, wherein the bias input is at a final bias value;
d) holding substantially constant the DC operating point attained in step c) while operating the VCO at the selected frequency; and
e) storing the final bias value for re-use as the bias input whenever it is desired to operate the VCO at the selected frequency.

* * * * *